(12) United States Patent
Wei et al.

(10) Patent No.: US 10,948,636 B2
(45) Date of Patent: Mar. 16, 2021

(54) COLOR FILTER SUBSTRATE, MANUFACTURING METHOD THEREOF, AND DISPLAY PANEL

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Xiongzhou Wei, Beijing (CN); Min Li, Beijing (CN); Chao Liu, Beijing (CN); Huaqing Liu, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 191 days.

(21) Appl. No.: 16/021,548

(22) Filed: Jun. 28, 2018

(65) Prior Publication Data

US 2019/0086591 A1 Mar. 21, 2019

(30) Foreign Application Priority Data

Sep. 19, 2017 (CN) .......................... 201710851549.5

(51) Int. Cl.
*G03F 9/00* (2006.01)
*G02B 5/20* (2006.01)
*G03F 7/00* (2006.01)

(52) U.S. Cl.
CPC ............ *G02B 5/201* (2013.01); *G03F 7/0007* (2013.01)

(58) Field of Classification Search
CPC ......... G02F 1/133514; G02F 1/133516; G02B 5/201; G03F 7/0007
(Continued)

(56) References Cited

U.S. PATENT DOCUMENTS 5,268,245 A * 12/1993 Chiulli .................. G03F 7/0007
430/145
9,700,964 B2 * 7/2017 Howard ............. B23K 35/3605
(Continued)

FOREIGN PATENT DOCUMENTS

CN 100342272 C 10/2007
CN 104835830 A 8/2015
(Continued)

OTHER PUBLICATIONS

First Office Action for Chinese Patent Application No. 201710851549.5 dated Sep. 26, 2019.

*Primary Examiner* — Audrey Y Chang
(74) *Attorney, Agent, or Firm* — Calfee, Halter & Griswold LLP

(57) ABSTRACT

A color filter substrate, a manufacturing method thereof, and a corresponding display panel. The manufacturing method of the color filter substrate includes: providing a substrate; forming an array of a plurality of pixel units on the substrate, wherein each pixel unit comprises a first sub-pixel, a second sub-pixel and at least two third sub-pixels, the at least two third sub-pixels being made of an irreversible temperature-sensitive pigment; and performing a temperature-variation treatment on one third sub-pixel in each pixel unit such that the one third sub-pixel changes color and becomes a fourth sub-pixel.

4 Claims, 4 Drawing Sheets

(58) Field of Classification Search
USPC .......................... 359/891; 349/106; 430/5, 7
See application file for complete search history.

(56) References Cited

U.S. PATENT DOCUMENTS

| | | |
|---|---|---|
| 2005/0134788 A1 | 6/2005 | Park |
| 2006/0098316 A1* | 5/2006 | Tatsuzawa ........ G02F 1/133516 |
| | | 359/891 |
| 2010/0182549 A1* | 7/2010 | Miyashita ......... G02F 1/133514 |
| | | 349/106 |
| 2019/0064648 A1 | 2/2019 | Wei et al. |
| 2019/0293995 A1 | 9/2019 | Wei et al. |

FOREIGN PATENT DOCUMENTS

| | | |
|---|---|---|
| CN | 106773278 A | 5/2017 |
| CN | 107065290 A | 8/2017 |
| CN | 107479244 A | 12/2017 |

\* cited by examiner

COLOR FILTER SUBSTRATE, MANUFACTURING METHOD THEREOF, AND DISPLAY PANEL

CROSS REFERENCE TO RELATED APPLICATION(S)

The present application claims the priority of the Chinese patent application No. 201710851549.5 filed on Sep. 19, 2017, the entire disclosure of which is incorporated herein by reference.

TECHNICAL FIELD

The present disclosure relates to the field of display technologies, and particularly to a color filter substrate, a manufacturing method thereof, and a display panel.

BACKGROUND ART

With increasing requirements for low-cost devices on the market, a display panel with better light transmittance is needed. At present, producers are adopting color filters, e.g., filter layers of four colors including W (white), R (red), G (green) and B (blue), to form a color display picture. By doing this, not only the transmittance of the product can be improved, but the power consumption of the product can also be reduced.

In an existing color filter, the filter layer for W pixels is usually made in the following two ways. In a first way, after forming the filter layers for R, G and B pixels, an additional process is performed separately to make the filter layer for W pixels. This manufacturing approach has problems such as a long production cycle and a high product cost. In a second way, the filter layer for W pixels is made by a coating process. Although this approach can reduce the manufacture cost, the obtained filter layer for W pixels and the filter layers for other pixels have large segment differences. In this case, the display panel will be subject to problems such as poor touch and non-uniformity in dark states.

SUMMARY

According to one aspect of the present disclosure, a manufacturing method of a color filter substrate is provided. Specifically, the manufacturing method comprises: providing a substrate; forming an array of a plurality of pixel units on the substrate, wherein each pixel unit comprises a first sub-pixel, a second sub-pixel and at least two third sub-pixels, the at least two third sub-pixels being made of an irreversible temperature-sensitive pigment; and performing a temperature-variation treatment on one third sub-pixel in each pixel unit such that the one third sub-pixel changes color and becomes a fourth sub-pixel.

According to a specific implementation, in the manufacturing method of a color filter substrate provided by an embodiment of the present disclosure, the at least two third sub-pixels in each pixel unit are formed by steps of: doping a photoresist with the irreversible temperature-sensitive pigment; applying the doped photoresist on the substrate; and exposing and developing the doped photoresist on the substrate by using a mask plate, thereby obtaining the at least two third sub-pixels, wherein the mask plate comprises a mask pattern corresponding to the at least two third sub-pixels.

According to a specific implementation, in the manufacturing method of a color filter substrate provided by an embodiment of the present disclosure, the step of performing a temperature variation treatment on one third sub-pixel in each pixel unit comprises: heating one of the at least two third sub-pixels to a preset temperature by using a heating device for typography such that the one third sub-pixel changes color and becomes a fourth sub-pixel.

According to a specific implementation, in the manufacturing method of a color filter substrate provided by an embodiment of the present disclosure, the at least two third sub-pixels comprise green sub-pixels, and the fourth sub-pixel comprises a white sub-pixel.

According to a specific implementation, in the manufacturing method of a color filter substrate provided by an embodiment of the present disclosure, the step of providing a substrate comprises: providing a base material layer; and forming a black matrix on the base material layer. Furthermore, the manufacturing method further comprises: forming a protective layer on the array of the plurality of pixel units; and forming photo spacers on the protective layer.

According to a specific implementation, in the manufacturing method of a color filter substrate provided by an embodiment of the present disclosure, the irreversible temperature-sensitive pigment comprises a metal-containing phthalocyanine pigment.

According to a specific implementation, in the manufacturing method of a color filter substrate provided by an embodiment of the present disclosure, the step of heating one of the at least two third sub-pixels to a preset temperature comprises: overlaying the one third sub-pixel with a heating layer, and heating the one third sub-pixel to the preset temperature via the heating layer upon energization.

According to another aspect of the present disclosure, a color filter substrate is further provided. Specifically, the color filter substrate comprises: a substrate; an array of a plurality of pixel units arranged on the substrate, wherein each pixel unit comprises a first sub-pixel, a second sub-pixel, a third sub-pixel and a fourth sub-pixel, the third sub-pixel and the fourth sub-pixel being arranged on a same layer and made respectively of an irreversible temperature-sensitive pigment before and after heating.

According to a specific implementation, in the color filter substrate provided by an embodiment of the present disclosure, the third sub-pixel comprises a green sub-pixel, and the fourth sub-pixel comprises a white sub-pixel.

According to yet another aspect of the present disclosure, a display panel is further provided. Specifically, the display panel comprises the color filter substrate as described in any of the above embodiments.

DETAILED DESCRIPTION OF EMBODIMENTS

In order to render goals, features and advantages of the present disclosure to be clearer, the present disclosure will be further described below in detail with reference to drawings and embodiments.

Figure 1:
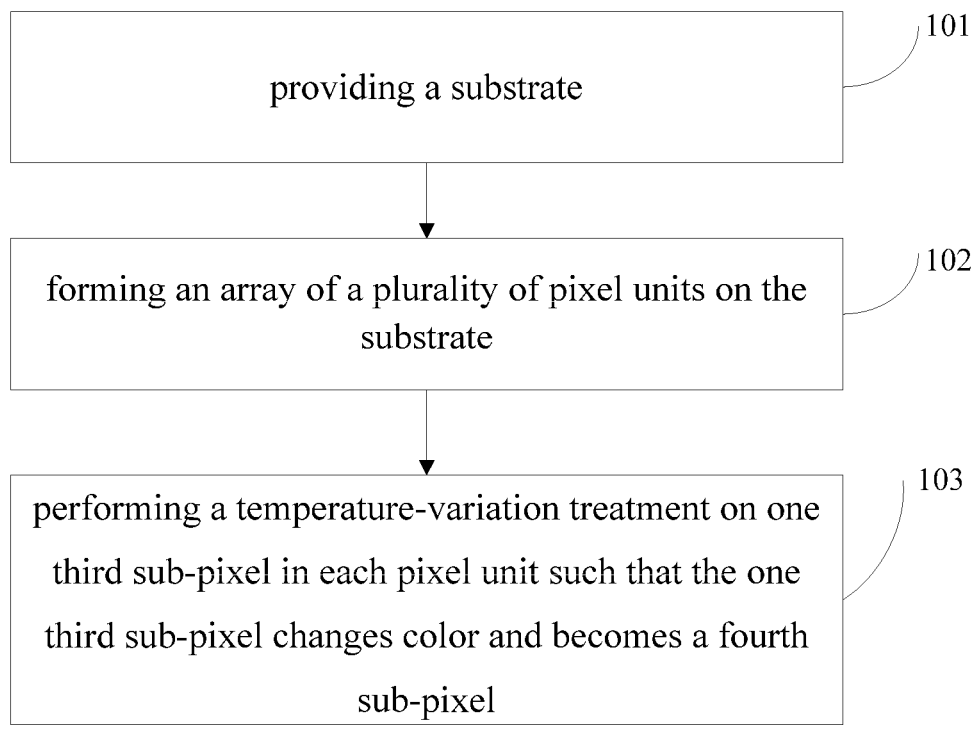
FIG. 1 is a flow chart illustrating a manufacturing method of a color filter substrate according to an embodiment of the present disclosure.

Referring to FIG. 1, a flow chart illustrating a manufacturing method of a color filter substrate according to an embodiment of the present disclosure is shown. Specifically, the manufacturing method can comprise steps as follows.

Step 101: providing a substrate 1.

Figure 2:
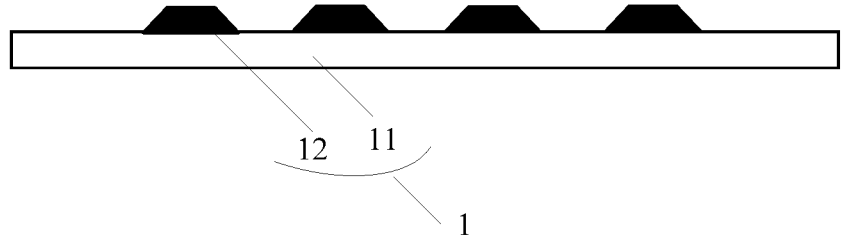
FIG. 2 shows a schematic structure view of a substrate as manufactured according to an embodiment of the present disclosure.

As shown in FIG. 2, the substrate 1 comprises: a base material layer 11 and a black matrix 12. As an example, the black matrix 12 can be formed by processes such as exposure, developing and baking.

The base material layer can be formed of transparent glass having silica as a main component. Besides, it should be pointed out that, apart from transparent glass, the base material layer can also be formed of transparent plastic for example, and the present disclosure is not limited thereto.

Step 102: forming an array of a plurality of pixel units on the substrate 1.

Figure 3:
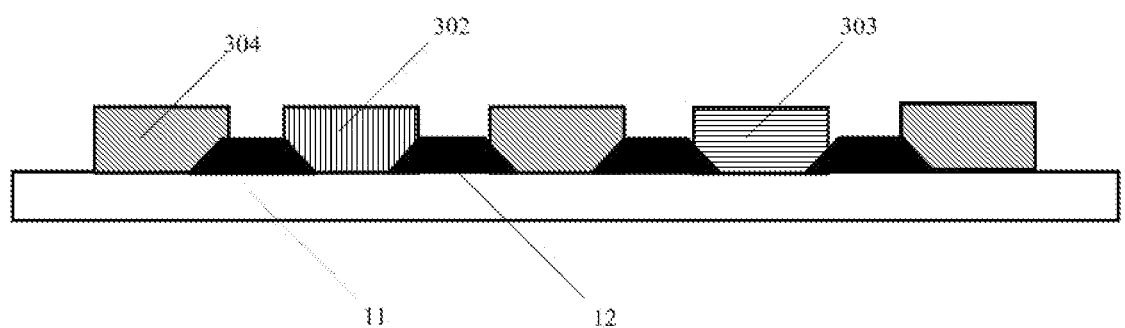
FIG. 3 shows a schematic structure view of each pixel unit as formed according to an embodiment of the present disclosure.

As shown in FIG. 3, each pixel unit comprises a first sub-pixel 302, a second sub-pixel 303 and at least two third sub-pixels 304. Furthermore, the at least two third sub-pixels are made of an irreversible temperature-sensitive pigment.

Optionally, the at least two third sub-pixels in each pixel unit are formed by steps of: doping a photoresist with the irreversible temperature-sensitive pigment; applying the doped photoresist on the substrate; and exposing and developing the doped photoresist on the substrate by using a mask plate, thereby obtaining the at least two third sub-pixels, wherein the mask plate comprises a mask pattern corresponding to the at least two third sub-pixels.

Figure 4:
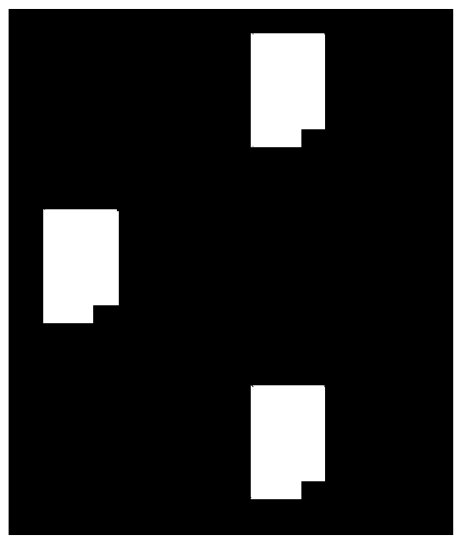
FIG. 4 shows a schematic structure view of a mask plate according to related technical solutions.
Figure 5:
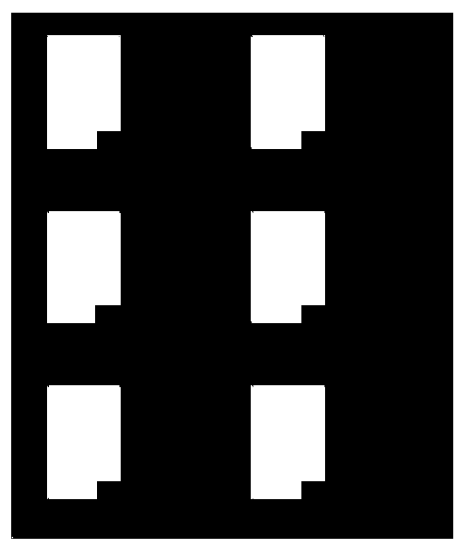
FIG. 5 shows a schematic structure view of a mask plate according to an embodiment of the present disclosure.

The mask plate in relevant technical solutions is designed as shown in FIG. 4, wherein a group of sub-pixels can be obtained by exposure and developing. In contrast, in an embodiment of the present disclosure, the design of mask plate is improved, wherein two groups of sub-pixel units can be obtained at one time by exposure and developing as shown in FIG. 5. According to embodiments of the present disclosure, two groups of sub-pixel units can be obtained from just one exposure of the mask plate. Thus, the process of manufacturing a filter layer for W pixels is reduced, which decreases the manufacture cost and meanwhile avoids segment differences between pixels.

In actual applications, the first sub-pixel can be a red sub-pixel, and the second sub-pixel can be a blue sub-pixel, or vice versa. Furthermore, the third sub-pixels can be green sub-pixels.

Figure 6:
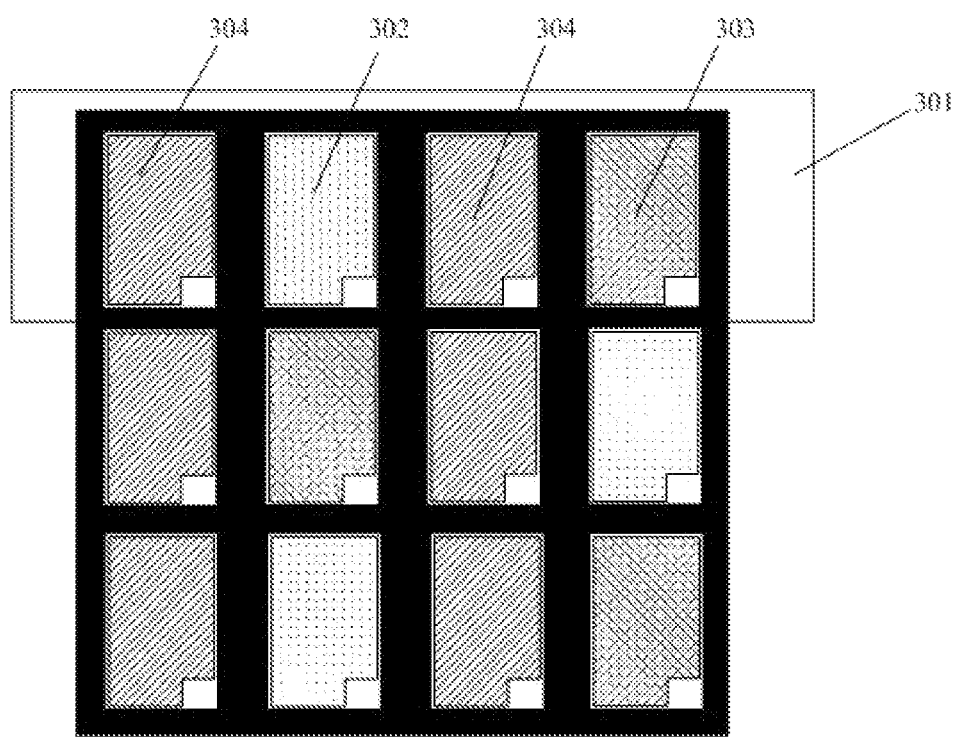
FIG. 6 shows a schematic structure view of the arrangement of pixel units as formed according to an embodiment of the present disclosure.

For example, each pixel unit 301 can comprise a red (R) first sub-pixel 302, a blue (B) second sub-pixel 303 and green (G) third sub-pixels 304. After step 101 and step 102, the pixels formed on the substrate are arranged in the form of GRGB, as shown in FIG. 6.

The irreversible temperature-sensitive pigment can comprise a metal-containing phthalocyanine pigment, wherein the metal comprises but is not limited to lead, nickel, cobalt, iron, cadmium, strontium, zinc, manganese, molybdenum, magnesium and copper. Optionally, the irreversible temperature-sensitive pigment is $C_{32}H_{16}N_8Cu$. Of course, other materials can also be used to make the irreversible temperature-sensitive pigment, as long as they can change color in case of temperature variations, and the present disclosure is not limited thereto.

Step 103: performing a temperature-variation treatment on one third sub-pixel 304 in each pixel unit such that the one third sub-pixel 304 changes color and becomes a fourth sub-pixel 801.

As an example, the first sub-pixel can be a red sub-pixel, and the second sub-pixel can be a blue sub-pixel, or vice versa. Furthermore, the third sub-pixels can be green sub-pixels, and the fourth sub-pixel is a white sub-pixel (W).

The material for making the third sub-pixels comprises an irreversible temperature-sensitive pigment, which will undergo a thermal decomposition, oxidization or synthesis reaction. Since the above reactions are all chemical reactions and are irreversible, the third sub-pixel will change color and become a fourth sub-pixel after it is heated. As an example, one green third sub-pixel will become a white sub-pixel.

In actual applications, the step of performing a temperature-variation treatment on one third sub-pixel in each pixel unit comprises: heating one of the at least two third sub-pixels to a preset temperature by using a heating device for typography such that the one third sub-pixel changes color and becomes a fourth sub-pixel.

The heating device for typography can heat any third sub-pixel such that the intended third sub-pixel changes color and becomes a fourth sub-pixel, and the pixel array is arranged as a whole in the form of WRGB.

Figure 7:
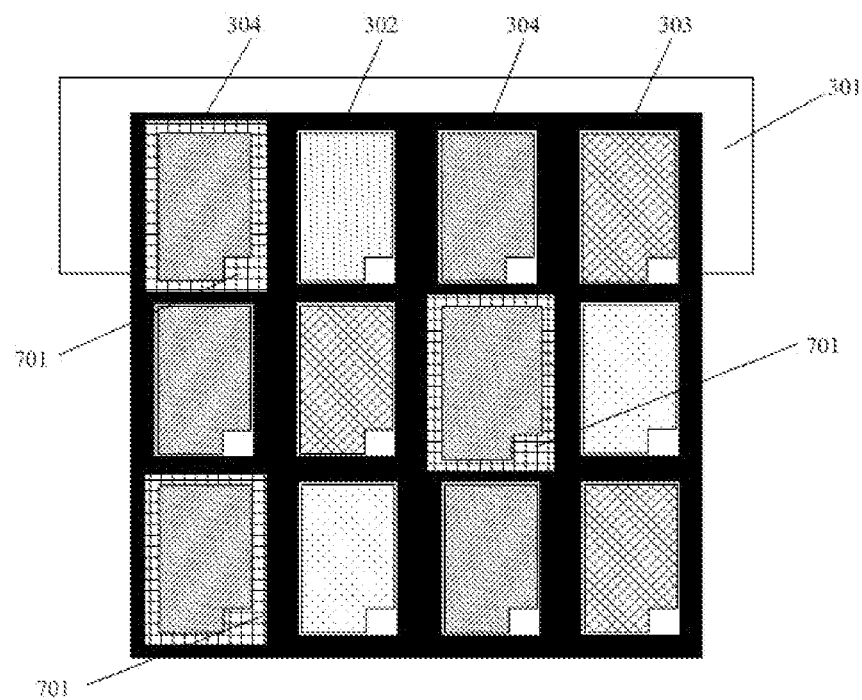
FIG. 7 is a schematic view showing heating of the third sub-pixel by using a heating layer according to an embodiment of the present disclosure.

In specific applications, a selected green sub-pixel 304 is heated by using a heating layer 701. As shown in FIG. 7, in an exemplary embodiment, the selected green sub-pixel can be overlaid by the heating layer 701. After being energized, the heating layer 701 can generate heat, thus heating the selected green sub-pixel. In the heating layer, a portion corresponding to a region beyond the selected green sub-pixel region is an adiabatic region. This means that the adiabatic region can be a notch region or a hollowed region. Obviously, a heat-insulation layer can also be arranged. In this way, the portion which is not heated by the heating layer will remain as the original color, while the portion heated by the heating layer will turn into green. Alternatively, any other suitable way can also be taken, and the present disclosure is not limited thereto.

Specifically, the temperature for heating can be set by those skilled in the art in any suitable manner. For example, a temperature threshold can be set based on human experience. Alternatively, the temperature can be set based on historical data. Typically, the temperature is generally set between 0° C.-500° C., but the present disclosure is not limited thereto. For example, the irreversible temperature-sensitive pigment $C_{32}H_{16}N_8Cu$ can turn from a green sub-pixel into a white sub-pixel at a temperature of 460° C. Therefore, the temperature can be set to be 460° C. as well.

Furthermore, the method further comprises: after the completion of steps 101-103, forming a protective layer on the array of the plurality of pixel units and forming photo spacers on the protective layer.

According to an embodiment of the present disclosure, the third sub-pixels are made of an irreversible temperature-sensitive pigment. In this case, two third sub-pixels can be made at the same time in each pixel unit by one exposure and developing. Then, by performing a temperature-variation treatment on one of the third sub-pixels, a fourth sub-pixel with an irreversible color can be obtained. In this way, no additional process is needed for manufacturing separately a filter layer for W pixels. This helps to simplify the manufacture process of pixel units, reduce the segment differences between pixels, and in the meanwhile decrease the manufacture cost.

It should be noted that in the above method embodiments, for descriptive simplicity, the method is expressed as a combination of a series of actions. However, those skilled in the art should know that the present disclosure is not limited by the sequence of the actions as described herein, because some of the steps can be carried out simultaneously or in other sequences according to embodiments of the present disclosure. Moreover, those skilled in the art should also know that the embodiments as described in the detailed description are all optional embodiments, and the actions involved therein are not necessarily indispensable in the present disclosure.

According to an embodiment of the present disclosure, embodiments of a corresponding color filter substrate are also provided to carry out the contents in the above method embodiments.

Figure 8:
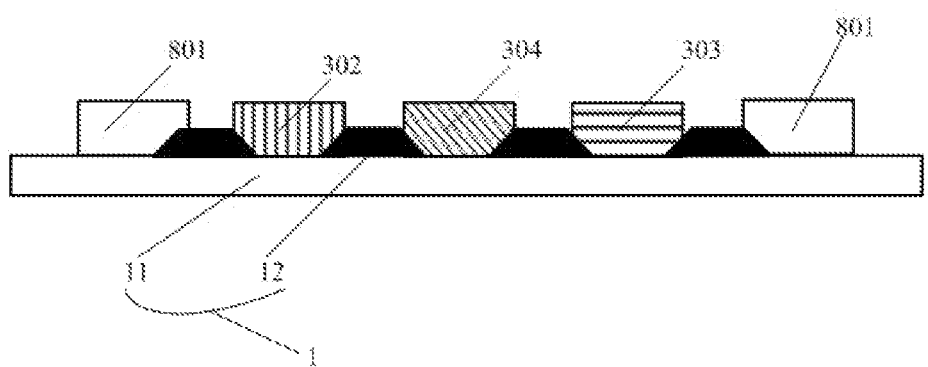
FIG. 8 shows a block diagram of a color filter substrate according to an embodiment of the present disclosure.

Referring to FIG. 8, a block diagram of the color filter substrate according to an embodiment of the present disclosure is shown. Specifically, the color filter can comprise: a substrate 1; and a plurality of pixel units as distributed in an array on the substrate 1. Each pixel unit comprises: a first sub-pixel 302, a second sub-pixel 303, a third sub-pixel 304 and a fourth sub-pixel unit 801. The fourth sub-pixel unit 801 and the third sub-pixel 304 are arranged on a same layer. Besides, the third sub-pixel 304 and the fourth sub-pixel 801 are made respectively of an irreversible temperature-sensitive pigment before and after heating.

Optionally, the third sub-pixel 304 comprises a green sub-pixel and the fourth sub-pixel 801 comprises a white sub-pixel.

According to an embodiment of the present disclosure, the third sub-pixels are made of an irreversible temperature-sensitive pigment. In this case, two third sub-pixels can be made at the same time in each pixel unit by one exposure and developing. Then, by performing a temperature-variation treatment on one of the third sub-pixels, a fourth sub-pixel with an irreversible color can be obtained. In this way, no additional process is needed for manufacturing separately a filter layer for W pixels. This simplifies the manufacture process of pixel units, reduces the segment differences between pixels, and in the meanwhile decreases the manufacture cost.

According to yet another aspect of the present disclosure, a display panel is further provided, comprising the color filter substrate as described in any of the above embodiments.

It should be noted that in embodiments of the present disclosure, the display panel can be applied in any product or component having a display function, such as a cellphone, a tablet computer, a television, a notebook computer, a digital photo frame, a navigator and the like.

The display panel has all advantages of the color filter substrate as described in any of the above embodiments, which will not be repeated herein for simplicity.

For the device embodiment, since it is basically similar to the method embodiment, it is described simply, and the corresponding explanations of the method embodiment can be referred to for related contents.

Embodiments in the detailed description are all described in a progressive manner, and what each embodiment emphasizes is a difference of the embodiment from the other embodiments. For the same or similar portions between various embodiments, they can refer to each other.

Those skilled in the art can easily conceive that any combination of the above embodiments is feasible. Therefore, any combination of the above embodiments also belongs to the solution of the present disclosure. However, they will not be detailed herein limited by the length of the detailed description.

It should be noted that relational terms such as "first" and "second" are only used herein for distinguishing one entity or operation from another entity or operation, and they do not necessarily require or imply the presence of any of such actual relations or sequences between the entities or operations. Moreover, terms such as "comprise" and "include" comprise not only the designated elements, but also other elements not explicitly listed. Alternatively, they can also comprise inherent elements for such a process, method, article or device. Without more limitations, an element defined by the wording of "comprising" does not exclude the presence of further same elements in the process, the method, the article or the device comprising the element.

In addition, the wording "and/or" means that both an "AND" relationship and an "OR" relationship are involved herein. As an example, if there is an "AND" relationship between solution A and solution B, it indicates that solution A and solution B can be comprised in an embodiment simultaneously. Alternatively, if there is an "OR" relationship between solution A and solution B, it indicates that either solution A or solution B can be comprised in an embodiment.

Although optional embodiments of the present disclosure have been described, those skilled in the art can make further variations and modifications to these embodiments once they know the basic inventive concept. Therefore, the appended claims should be construed as including these optional embodiments and all variations and modifications falling within the scopes of the present disclosure.

The color filter substrate, the manufacturing method thereof and the corresponding display panel as provided in embodiments of the present disclosure have been introduced in detail. Principles and implementations of the present disclosure are illustrated herein by using specific examples. The explanations of these embodiments are only used for helping to understand the method of the present disclosure and the core concept thereof. Meanwhile, a person having ordinary skills in the art can make various modifications to the specific implementations and application scopes according to the basic idea of the present disclosure. Therefore, the content of the detailed description should not be construed as limiting the present disclosure.

The invention claimed is:

1. A manufacturing method of a color filter substrate, comprising:
    providing a substrate;
    forming an array of a plurality of pixel units on the substrate, wherein each pixel unit comprises a first sub-pixel, a second sub-pixel and at least two third sub-pixels, the at least two third sub-pixels being made of an irreversible temperature-sensitive pigment; and
    performing a temperature-variation treatment on one third sub-pixel in each pixel unit such that the one third sub-pixel changes color and becomes a fourth sub-pixel;
    wherein the at least two third sub-pixels in each pixel unit are formed by steps of:
        doping a photoresist with the irreversible temperature-sensitive pigment;
        applying the doped photoresist on the substrate; and exposing and developing the doped photoresist on the substrate to form two columns of third sub-pixels by using a mask plate, thereby obtaining the at least two third sub-pixels in each pixel unit; the at least two third sub-pixels in each pixel unit being located in a same row, wherein the mask plate comprises a mask pattern corresponding to the two columns of third sub-pixels;

wherein the step of performing a temperature-variation treatment on one third sub-pixel in each pixel unit comprises:

overlaying the one third sub-pixel with a heating layer, and heating the one third sub-pixel to the set temperature via the heating layer upon energization such that the one third sub-pixel changes color and becomes a fourth sub-pixel.

2. The manufacturing method according to claim 1, wherein the at least two third sub-pixels comprise green sub-pixels, and wherein the fourth sub-pixel comprises a white sub-pixel.

3. The manufacturing method according to claim 1, wherein the irreversible temperature-sensitive pigment comprises a metal-containing phthalocyanine pigment.

4. The manufacturing method according to claim 1, wherein the at least two third sub-pixels comprise green sub-pixels, and the fourth sub-pixel comprises a white sub-pixel.

* * * * *